(12) United States Patent
Suleski

(10) Patent No.: US 7,855,046 B2
(45) Date of Patent: Dec. 21, 2010

(54) METHOD AND APPARATUS FOR FABRICATING SHAPED STRUCTURES AND SHAPED STRUCTURES INCLUDING ONE-, TWO- OR THREE-DIMENSIONAL PATTERNS INCORPORATED THEREIN

(75) Inventor: Thomas J. Suleski, Harrisburg, NC (US)

(73) Assignee: The University of North Carolina at Charlotte, Charlotte, NC (US)

( * ) Notice: Subject to any disclaimer, the term of this patent is extended or adjusted under 35 U.S.C. 154(b) by 681 days.

(21) Appl. No.: 11/400,684

(22) Filed: Apr. 7, 2006

(65) Prior Publication Data

US 2006/0228635 A1    Oct. 12, 2006

Related U.S. Application Data

(60) Provisional application No. 60/668,957, filed on Apr. 7, 2005.

(51) Int. Cl.
*H01L 21/00* (2006.01)
*G03F 1/00* (2006.01)
(52) U.S. Cl. .......................................... 430/311; 430/5
(58) Field of Classification Search ..................... 430/5, 430/311, 270.1, 1
See application file for complete search history.

(56) References Cited

U.S. PATENT DOCUMENTS

| | | | |
|---|---|---|---|
| 5,677,089 A * | 10/1997 | Park et al. | ....................... 430/5 |
| 6,027,595 A | 2/2000 | Suleski | |
| 6,071,652 A | 6/2000 | Feldman et al. | |
| 6,638,667 B2 | 10/2003 | Suleski et al. | |
| 6,900,881 B2 | 5/2005 | Sreenivasan et al. | |
| 6,929,762 B2 | 8/2005 | Rubin | |
| 7,235,474 B1 * | 6/2007 | Dakshina-Murthy et al. | ..... 438/597 |
| 2005/0073671 A1 * | 4/2005 | Borodovsky | .................. 355/77 |

OTHER PUBLICATIONS

Satoru Shoji, Nicholas Smith, and Satoshi Kawata, "Photofabrication of a photonic crystal using interference of a UV laser," Jun. 16, 1999, Proc. SPIE 3740, pp. 541-544 (1999).*
Garrett J. Schneider, Eric D. Wetzel, Janusz A. Murakowski, and Dennis W. Prather, "Fabrication of three-dimensional Yablonovite photonic crystals by multiple-exposure UV interference lithography," Jan. 25, 2005, Proc. SPIE 5720, pp. 9-17 (2005).*
Colburn, et al., "Step and Flash Imprint Lithography for sub-100nm Patterning," downloaded Apr. 5, 2006, THe University of Texas at Austin, http://www.molecularimprints.com/NewsEvents/tech_articles/UT_SFIL_SPIE_2000.pdf.

(Continued)

*Primary Examiner*—Mark F Huff
*Assistant Examiner*—Jonathan Jelsma
(74) *Attorney, Agent, or Firm*—Summa, Additon & Ashe, P.A.

(57) ABSTRACT

The invention includes a template useful for the fabrication of devices having one, two, or three dimensional geometries. The template can include at least a first patterned surface and a mask integrated into the template for creating an interference pattern when radiation is passed through the mask. The template can be useful in the production of shaped structures including one-, two-, or three-dimensionally shaped patterns, and further including at least one shaped surface.

52 Claims, 3 Drawing Sheets

OTHER PUBLICATIONS

Suleski, et al., "Fabrication of high-spatial-frequency gratings through computer-generated near-field holography," Optics Letters, vol. 24, No. 9, pp. 602-604, May 1, 1999.

Zanke, et al., "Large-area patterning for photonic crystals via coherent diffraction lithography," J.Vac.Sci. Technol. B 22(6), pp. 3352-3355, Dec. 13, 2004.

Gil, et al., "The case for diffractive optics in maskless lithography," J.Vac.Sci.Technol. B(21)(6), pp. 2810-2814, Dec. 5, 2003.

Flanders, et al., "Spatial period division—A new technique for exposing submicrometer-linewidth periodic and quasiperiodic patterns," J.Vac.Sci.Technol., 16(6), pp. 1949-1952, Nov./Dec. 1979.

Divliansky, et al., "Fabrication of three-dimensional polymer photonic crystal structures using single diffraction element interference lithography," Applied Physics Letters, vol. 82, No. 11, pp. 1667-1669, Mar. 17, 2003.

Jeon, et al., "Fabricating complex three-dimensional nanostructures with high-resolution conformable phase masks," PNAS, vol. 101, No. 34, pp. 12428-12433, Aug. 24, 2004.

V. Berger, "From photonic band gaps to refractive index engineering," Optical Materials., vol. 11, pp. 131-142, Elsevier Science B.V., Orsay, France, Jan. 1999.

Resnick, et al., "Imprint lithography for integrated circuit fabrication," J.Vac.Sci.Technol. B21(6), pp. 2624-2631, Dec. 4, 2003.

Lin, et al., "Design and holographic fabrication of tetragonal and cubic photonic crystals with phase mask: toward the mass-production of three-dimensional photonic crystals," Applied Physics Letters 86, 071117, pp. 1-3, American Institute of Physics, Feb. 10, 2005.

Xu, et al., "Centrifugation and spin-coating method for fabrication of three-dimensional opal and inverse-opal structures as photonic crystal devices," Society of Photo-Optical Instrumentation Engineers, J. Microlith., Microfab., Microsyst., vol. 3, No. 1, pp. 168-173, Jan. 2004.

Suleski, et al., "Fabrication of optical microstructures through fractional Talbot imaging," Proceedings of SPIE, vol. 5720, pp. 86-93, SPIE, Bellingham, WA, 2005.

Suleski, "Diffractive Optics Fabrication," Encyclopedia of Optical Engineering, Marcel Dekker, Inc., pp. 374-387, 2003.

Suleski et al., "Fabrication Trends for Free-Space Microoptics," Journal of Lightwave Technology, vol. 23, No. 2, pp. 633-646, Feb. 2005.

Blanchet et al., "Printing Techniques for Plastic Electronics," Journal of Imaging Science and Technology, vol. 47, No. 4, pp. 296-303, Jul./Aug. 2003.

Piestun et al., "Synthesis of Three-Dimensional Light Fields and Applications," Proceedings of the IEEE, vol. 90, No. 2, pp. 222-244, Feb. 2002.

Zanke et al., "Large-area patterning for photonic crystals via coherent diffraction lithography," American Vacuum Society, vol. 22, No. 6, pp. 3352-3355, Nov./Dec. 2004.

Kunnavakkam et al., "Low-cost, low-loss microlens arrays fabricated by soft-lithography replication process," American Institute of Physics, vol. 82, No. 8, pp. 1152-1154, Feb. 24, 2003.

Davies et al., "Applicaitons of precision diamond machining to the manufacture of micro-photonics components," Proceedings of SPIE, vol. 5183, pp. 94-108, Bellingham, WA, 2003.

Mayers et al., "Crystallization of Mesoscopic Colloids into 3D Opaline Lattices in Packing Cells Fabricated by Replica Molding," Advanced Materials.

Campbell et al., "Fabrication of photonic crystals for the visible spectrum by holographic lithography," Nature, Macmillan Magazines Ltd., vol. 404, pp. 53-56, Mar. 2000.

* cited by examiner

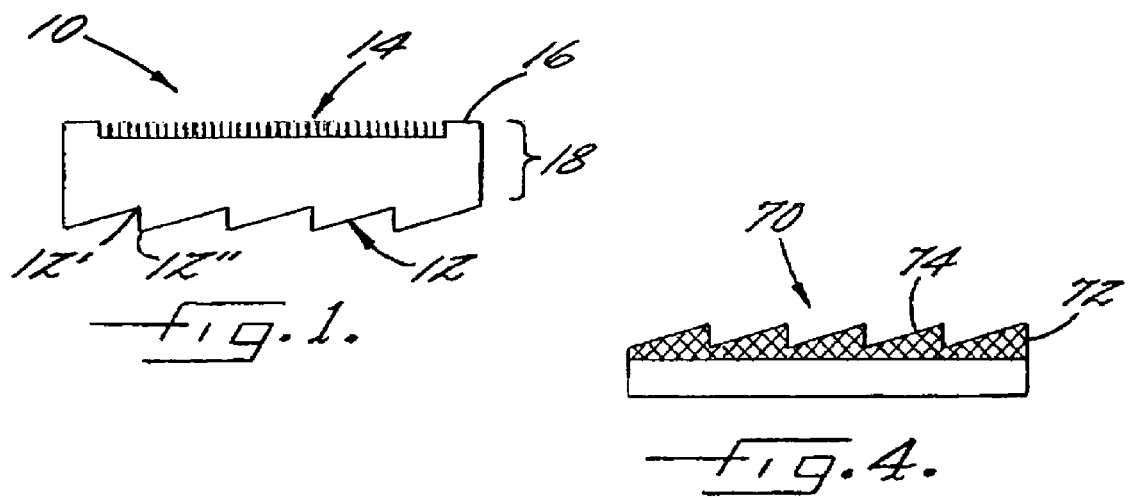
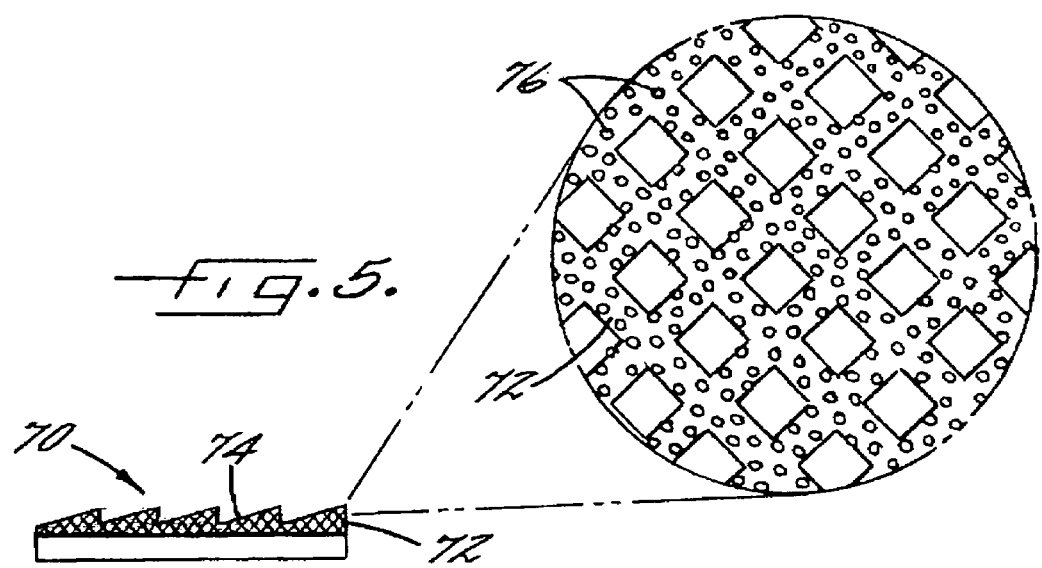

METHOD AND APPARATUS FOR FABRICATING SHAPED STRUCTURES AND SHAPED STRUCTURES INCLUDING ONE-, TWO- OR THREE-DIMENSIONAL PATTERNS INCORPORATED THEREIN

CROSS REFERENCE TO RELATED APPLICATION

This application hereby claims the benefit of commonly owned pending U.S. Provisional Patent Application Ser. No. 60/668,957, for Novel Methods and Applications of 1D, 2D and 3D Nanofabrication, filed Apr. 7, 2005. This application incorporates entirely by reference this provisional application.

BACKGROUND OF THE INVENTION

The invention relates to the fabrication of shaped structures that can be useful in the production of various devices including optical and photonic devices and structural devices.

New applications in multiple industries have driven needs for advances in manufacturing and integration technologies for optics and photonics. Functionality, miniaturization, and lower costs are nearly universal drivers for communications, sensors, biomedical applications, data storage, and other industries. These factors drive parallel needs for technical innovation and scalable, cost-efficient manufacturing. These drivers present significant research challenges and opportunities for further research in photonic components, systems, materials, and manufacturing.

Diffractive, refractive, and guided-wave micro-optics have become core technologies for individual components and within integrated optical microsystems. Both free-space and guided-wave optics offer a great deal of promise due to broad functionality and the potential for wafer-level manufacturing using techniques leveraged from the microelectronics industry. Achievable functions from both free-space and guided wave optics are ultimately defined by structure geometry and optical material properties.

Diffractive optics, refractive optics, sub-wavelength optics, photonic crystals, and optical waveguides fall under the general headings of micro-optics or nano-optics. As in the semiconductor industry, there is an ongoing push to manufacture smaller structures. For example, a variety of optical functions have been realized through fabrication of effective media with sub-wavelength structures to engineer a locally effective refractive index in the optical material.

Photonic crystals are another class of devices receiving a great deal of interest due to the wide range of functions that can be realized through fabrication on scales at or below the wavelength of light. These periodic structure exhibit a frequency range over which light propagation is forbidden, a property referred to as the photonic bandgap. One, two, and three-dimensional crystals have been created to implement functions such as optical circuits, optical add-drop functions, resonator cavities, slow light and wavelength conversion. Depending on the geometry, the device may perform more like a free-space component, and in other cases like a guided wave element. In nearly all cases, however, the components are challenging to fabricate, and even more difficult to manufacture, particularly for use at infrared or visible wavelengths.

Over the past decade, multiple examples of integration of passive micro-optics with active devices (MEMS, laser sources, detectors, etc.) have been demonstrated. Both hybrid and monolithic approaches have been used for integration of optical deices. The trend towards monolithic functional integration continues to accelerate due to the need for performance, new functionality, miniaturization, and cost reduction.

Metamaterials are materials that are structured at the micro- or nano-scale in order to give the composite useful properties or performance unrealizable from the homogeneous bulk. The results are materials that exhibit optical properties not observed in nature. The effective medium and photonic devices previously discussed may be considered metamaterials. Photonic crystals in particular have been the subject of significant international research due to their potential for manipulating light in ways that can not be achieved using homogeneous materials. The ability to form photonic crystals into non-planar shapes could enable, for example, the conversion of a complex unusable output mode from an intracavity source into a well-conditioned, quasi-plane wave. V. Berger, "From photonic band gaps to refractive index engineering," *Opt. Materials*, vol. 11, pp. 131-142, 1999. It is noted that structures in the Berger article are conceptional only and Berger does not describe the actual fabrication of such devices. Photonic crystal structures require dimensional tolerances of less than about 10 nm in many cases. Previous methods of producing photonic crystals typically do not achieve such tight tolerances.

Integrating and interfacing discrete nanoscale devices with components and systems that may be several orders of magnitude larger presents significant challenges. Similarly, ordering of the particles, proximity to other nanoparticles, and surrounding materials may alter their performance.

There are multiple techniques with the potential for large scale volume manufacturing of optical nanostructures. Lithography using holographic interference of multiple laser beams can be used, but this technique by itself offers limited flexibility for fabricating different structures. Minimum feature sizes below about 100 nm may be achievable using direct patterning with electron beam lithography, or modern step-and-repeat or step-and-scan projection lithography systems ("steppers") using resolution enhancing methods such as phase shifting masks, customized illumination schemes, immersion lithography, and extreme ultraviolet lithography. Each of these approaches typically requires expensive, complex equipment and processes to manufacture nano-structures. The serial nature of e-beam lithography typically renders the technique prohibitively expensive for anything more than a few components. Existing monolithic integration techniques often require similar manufacturing infrastructure, while hybrid integration requires additional equipment and processing steps, usually through serial assembly.

Phase masks have been previously described for synthesis of 3D light fields and the use of phase masks for fabrication of three-dimensional structures has been demonstrated in simple polymers. See R. Piestun and J. Shamir, "Synthesis of Three-Dimensional Light Fields and Applications," *Proc. of the IEEE*, vol. 90, pp. 222-244, 2002, which discusses light field generation; see also Divliansky, T. S. Mayer, K. S. Holliday, and V. H. Crespi, "Fabrication of three-dimensional polymer photonic crystal structures using single diffraction element interference lithography," *Appl. Phys. Lett.*, vol. 82, pp. 1667-1669, 2003; S. Jeon, J.-U. Park, R. Cirelli, S. Yang, C. E. Heitzman, P. V. Braun, P. J. A. Kenis, and J. A. Rogers, "Fabricating complex three-dimensional nanostructures with high-resolution conformable phase masks," *PNAS*, vol. 101, pp. 12428-12433, 2004, which discuss the fabrication of 3D structures with planar surfaces.

The majority of the work in three dimensional structured micro- and nano-particles has focused on the creation of 3D macroporous lattices from micro or nanoparticles through self assembly. Quantum dots as small as about 4 nm have been used to assemble theses structures, though typically spherical particles from 50 nm to several microns in diameter are used. In some cases, electric fields have been used to aid in the arrangement of the particles. These opal or inverse opal lattices (i.e., where the empty spaces in the lattices are infiltrated with a material and the original spheres are dissolved away) are usually used as 3D photonic crystals, and little attention has been given to manufacturing or to forming the lattice into larger structures of specific geometries.

A typical assembly method utilizes polyurethane packing cells to form 3D lattices of mesoscopic colloids. These homogeneous lattices were developed over an area of 0.5 $cm^2$, though the assembly process typically requires a couple of days. B. T. Mayers, B. Gates, and Y. Xia, "Crystallization of Mesoscopic Colloids into 3D Opaline Lattices in Packing Cells Fabricated by Replica Molding," *Adv. Mater.*, vol. 12, pp. 1629-1632, 2000. In this method, the shape of the mold is very simple and not a direct factor in the optical performance of the fabricated component. Structured nano-patterning has also been performed using dip-pen writing with nanoparticle inks as serial, single point processes for forming structural arrangements of nanoparticles.

Methods of soft lithography have been demonstrated as a means to pattern hybrid composite materials. For example, researchers utilized soft lithography to print electronic inks formed by incorporating nanoparticles into a host matrix. G. Blanchet and J. A. Rogers, "Printing Techniques for Plastic Electronics," *J. Imaging Science and Tech.*, vol. 47, pp. 296-303, 2003. Microlens arrays have been molded using photopolymers loaded with functionalized silica nanoparticles to increase the structural stability of the polymer. M. V. Kunnavakkam, F. M. Houlihan, M. Schlax, J. A. Liddle, P. Kolodner, O. Nalamasu, and J. A. Rogers, "Low-cost, low-loss microlens array fabricated by soft-lithography replication process," *Appl. Phys. Lett.*, vol. 82, pp. 1152-1154, 2003. Researchers also demonstrated the creation of nanocomposite optical gain media and presented methods for synthesis of polymer and solgel nanocomposites.

None of the previously described synthetic nanofabrication methods provide commercially viable, scalable paths for 3D nanofabrication. Similarly, none of the previously described synthetic nanofabrication methods provide a method in which the shape of the nanocomposite structure plays an integral role in the overall functionality of the resulting device.

BRIEF SUMMARY OF THE INVENTION

In one aspect the invention is a template that can be useful for the fabrication of shaped structures, including 1-dimensional, 2-dimensional, and/or 3-dimensional devices. The template can include at least a first patterned surface and an integrated mask for creating an interference pattern when radiation is passed through the mask.

In another aspect, the invention is a method of fabricating shaped structures. The method includes positioning a patterned surface of a form mold in proximity to a surface of an object on which a structure is to be formed. The method further includes substantially filling a space between the object on which the structure is to be formed and the patterned surface with a radiation sensitive material, creating a radiation interference pattern, and exposing the radiation sensitive material to the radiation interference pattern to effect a chemical and/or physical change within the radiation sensitive material and to form at least a first pattern in the radiation sensitive material corresponding to the radiation interference pattern. The patterned surface of the form mold can also contact the radiation sensitive material so as to form at least a second pattern in the resultant structure corresponding to the patterned surface of the form mold.

In yet another aspect, the invention is a shaped structure that includes at least one pattern within the structure and at least one shaped surface.

In yet another aspect, the invention is a scalable method of fabricating shaped structures. The method includes dispensing a radiation sensitive material onto a growth surface and positioning a form mold having a first surface including a patterned surface over the dispensed radiation sensitive material such that the patterned surface is facing the radiation sensitive material. The method further includes creating a radiation interference pattern and exposing the radiation sensitive material to the radiation interference pattern to effect a chemical and/or physical change in the radiation sensitive material and to impart to the material at least one pattern corresponding to the radiation interference pattern. The form mold can be removed from the material and moved to a different position on the growth surface, and each of the preceding steps can be repeated at least one time to create at least two or more discrete structures across at least a portion of the growth surface.

The foregoing, as well as other objectives and advantages of the invention and the manner in which the same are accomplished, are further discussed within the following detailed description and its accompanying drawings.

BRIEF DESCRIPTION OF THE DRAWINGS

Figure 2A:
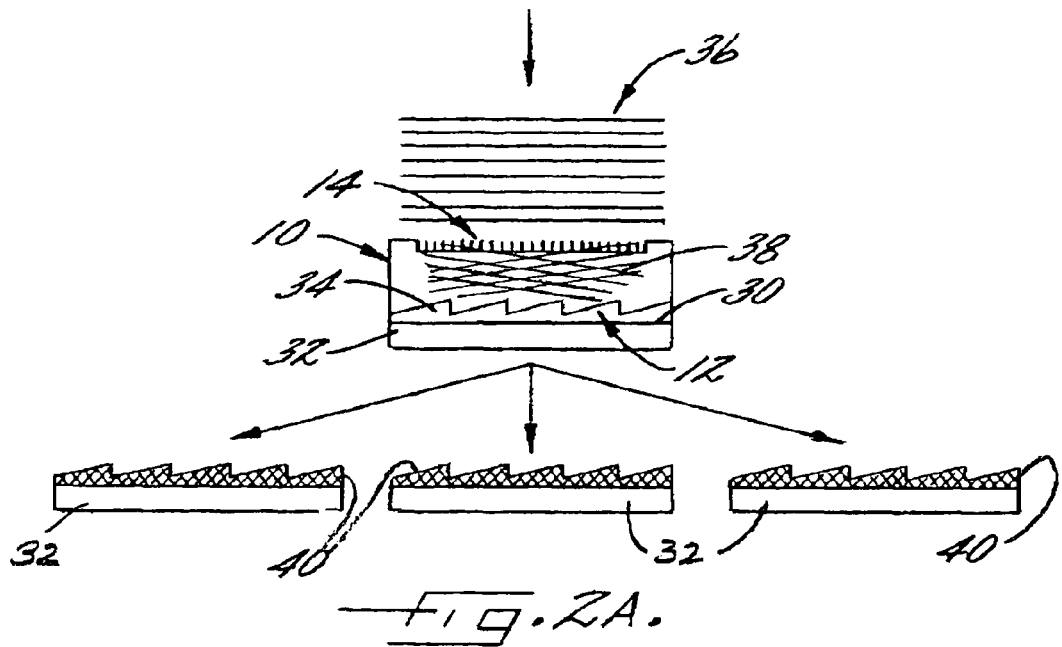
Figure 2B:
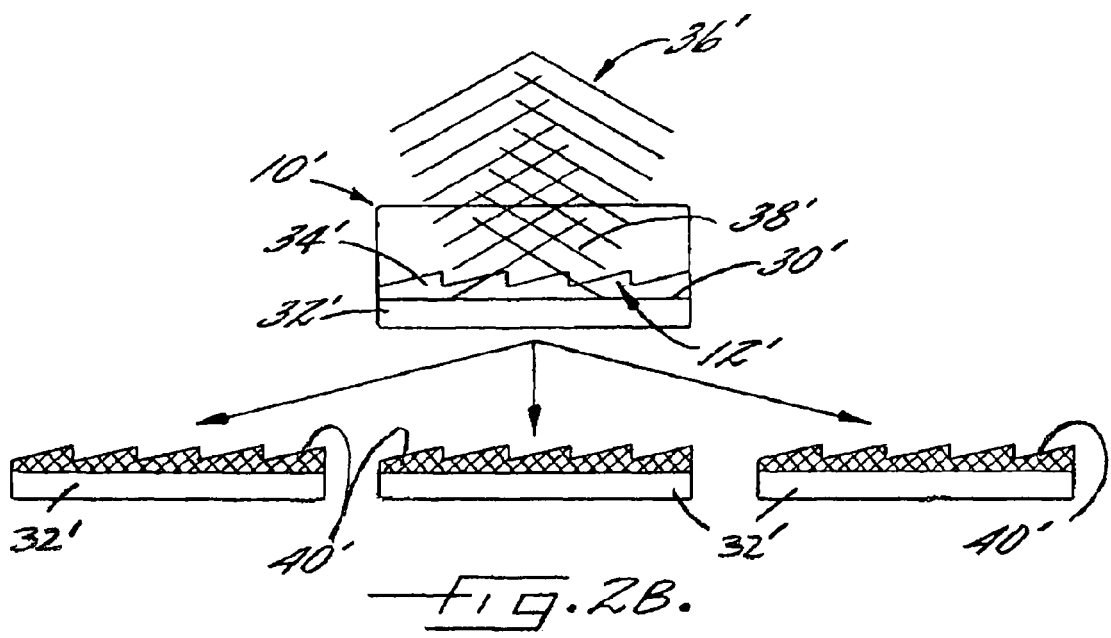

Having thus described the invention in general terms, reference will now be made to the accompanying drawings, which are not necessarily drawn to scale, and in which:

FIG. 1 is a schematic cross sectional view of a representative form mold in accordance with the present invention;

FIGS. 2A and 2B schematically illustrate a method for fabricating shaped structures in accordance with the present invention;

FIGS. 3A-D are top perspective views of a growth surface and schematically illustrate a method for fabricating a plurality of shaped structures in accordance with the present invention;

FIG. 4 is a schematic cross sectional view of a representative device structure in accordance with the present invention; and FIG. 5 is a schematic cross sectional view of another representative device structure in accordance with the present invention and includes a greatly enlarged top planar view of a portion of the device.

DETAILED DESCRIPTION OF THE INVENTION

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements. Like numbers refer to like elements throughout.

The terminology used herein is for the purpose of describing particular embodiments only and is not intended to be limiting of the invention. As used herein, the term "and/or" includes any and all combinations of one or more of the associated listed items. As used herein, the singular forms "a,"

"an," and "the" are intended to include the plural forms as well as the singular forms, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one having ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

In describing the invention, it will be understood that a number of techniques and steps are disclosed. Each of these has individual benefit and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

In one aspect, and as depicted in FIG. 1, the invention includes a patterned template 10 (also referred to herein as, and including, a patterned stamp, a form mold, and the like), which can be useful in the production of a variety of shaped objects for different applications, including devices having desired optical and/or structural properties. In particular, patterned template 10 can be useful in the fabrication of 1-dimensionally, 2-dimensionally, and/or 3-dimensionally shaped structures, which structures can further include 1-, 2- and/or 3-dimensionally shaped patterns within and/or throughout the volume of the structure.

Patterned template 10 includes at least a first surface configuration for shaping (also referred to herein, and including, molding and/or patterning) a surface of an object contacted by the surface configuration of the template, such as an object formed of a radiation sensitive material as described herein. FIG. 1 illustrates one embodiment in which the template includes a patterned surface 12 having a plurality of features thereon defining a pattern that can be transferred into a radiation sensitive material, and, optionally, subsequently into a suitable substrate underlying the radiation sensitive material. Patterned surface 12 may include any of a variety of patterns thereon, as well as combinations of patterns.

FIG. 1 illustrates an exemplary patterned surface 12 including a repeating pattern formed by a plurality of spaced apart recessions 12' and protrusions 12". The illustrated pattern includes alternating sloped or angled sidewalls and perpendicular sidewalls, but the present invention is not so limited, and the recessions can correspond to any suitable feature desired for a particular application. As another non-limiting example, patterned surface 12 can include at least one or more generally non-repeating patterns. In other embodiments of this aspect of the invention, patterned surface 12 can include combinations of different patterns, including combinations of at least one or more repeating patterns, combinations of at least one or more non-repeating patterns, and combinations of at least one or more repeating and non-repeating patterns. The selection of a particular pattern can depend on the particular requirements of the device to be manufactured and can be readily determined by the skilled artisan.

The dimensions of the features forming the patterned surface can vary, again depending on the particular requirements of the structure to be fabricated using the mold, and can be readily determined by the skilled artisan. Generally, the recessions and protrusions can be nano-, micro-, milli- and/or macro-scaled, as well as combinations of differently scaled features.

As a non-limiting example, exemplary mold geometries that can be useful in the production of devices such as gratings, photonic crystals, and the like can include substantially sharply defined features having heights and widths as can be determined by the skilled artisan. As a non-limiting example, such mold geometries can have heights ranging from about 10 to about 2000 nanometers (nm), and larger (which the skilled artisan will appreciate can depend on the radiation wavelength), and widths ranging from about 10 nanometers up to 10 s, and even 100 s, of microns (which the skilled artisan will appreciate can vary depending on the desired optical properties of the resultant device fabricated using the template). Other non-limiting exemplary mold geometries that can be useful in the production of devices such as refractive microlenses can include substantially smoothly varying shapes with heights ranging from about 1 micron to about 100 microns, and greater, and apertures ranging from about 1 micron, and greater, to about one millimeter, and greater. Mold geometries having feature dimensions outside of these ranges can also be useful in the present invention.

Patterned template 10 may further include a component associated therewith for manipulating or directing radiation in a manner sufficient to create a radiation pattern, which pattern can be imparted into an object fabricated using the template of the invention, such as an object formed of a radiation sensitive material. Exemplary components for manipulating or directing radiation include components capable of creating a radiation interference pattern, such as but not limited to masks, including phase masks, amplitude masks, and the like; diffractive optical structures, including gratings, computer generated holograms, beam shapers, beam splitters, beam conditioners, wavefront shapers, and the like; refractive optical structures, including lenses, beam shapers, prisms, and the like; and combinations thereof. The present invention is not limited to the creation of radiation interference patterns and also includes radiation patterns that are created using means other than interference. Other suitable components for manipulating radiation can include, for example, gratings, amplitude masks, arrays of microlenses, and the like, for manipulating and/or segmenting radiation patterns, without necessarily requiring radiation interference to create a radiation pattern. For ease of discussion herein, reference will be made to the use of an integrated mask 14, and the creating of a radiation interference pattern, although the skilled artisan will understand that the invention is not so limited.

FIG. 1 illustrates an exemplary embodiment of the invention in which template 10 includes an integrated mask 14 capable of creating an interference pattern when radiation is passed therethrough. Mask 14 can include a periodic structure capable of creating substantially periodic radiation interference patterns for the creation of substantially uniform structures. Alternatively, mask 14 can include a non-periodic structure to create arbitrary light distributions for the creation of aperiodic structures.

Mask 14 can include any of the types of masks known in the art capable of creating a radiation interference pattern, including without limitation at least one or more of phase masks, amplitude masks, and the like, as well as combinations thereof. The term phase mask typically refers to a mask designed to alter the relative phase of portions of an incident electromagnetic wave, and the term amplitude mask typically refers to a mask designed to alter the amplitude of portions of an incident electromagnetic wave.

Mask 14 may be incorporated in the mold 10 in any manner suitable for creating the desired radiation interference pattern. As a non-limiting example, as illustrated in FIG. 1, mask 14 can be positioned on a surface 16 opposing patterned surface 12 of mold 10. The present invention is not limited to the illustrated embodiment, and the mask 14 can also be placed in one or more other locations within mold 10 (i.e., embedded within the structure of mold 10) and/or along other surfaces of mold 10. In an exemplary embodiment of the present invention, mask 14 can include an integrated grating. The spatial period of the grating can vary, depending on the desired function of the resultant device fabricated using the template, and can be readily determined by the skilled artisan. As a non-limiting example, the spatial period can range from about 100 nm to 1000 microns, although spatial periods outside of this range can also be used in accordance with the invention.

In this invention, patterned surface 12 and mask 14 can be separated from one another by a gap distance 18 of a sufficient size to create a desired pattern and structure of a device manufactured using patterned template 10. C. Zanke, M. Qi, and H. I. Smith, "Large-area patterning for photonic crystals via coherent diffraction lithography," *J.Vac. Sci. Technol. B*, vol. 22, pp. 3352-3355 (2004); see also T. J. Suleski, Y. C. Chuang, P. C. Deguzman, and R. A. Barton, "Fabrication of optical microstructures through fractional Talbot imaging," in *Micromachining Technology for Micro-Optics and Nano-Optics III*, vol. 5720, E. G. Johnson, G. P. Nordin, and T. J. Suleski, Eds.: Proc. SPIE, 2005, pp. 86-93. The distance between patterned surface 12 and mask 14 can vary, depending upon the particular requirements of a given device to be manufactured using patterned template 10. The gap distance can be determined by the skilled artisan and can vary, for example, from about 500 microns to about 7 millimeters, for example, from about 100 microns to about 15 millimeters, although gap distances outside of these ranges can also be used. These gap distances are representative only, and reflect the thickness of the template. The skilled artisan will appreciate that gap distance, for example in air between a grating and a photoresist surface, can be much smaller (or larger) than these distances.

Patterned template 10 can be formed of a variety of materials. In various embodiments, the template can be fabricated using a material that allows the template to be substantially transparent to the passage of actinic radiation therethrough. Suitable materials useful for the production of the patterned template can include without limitation quartz, silicon, indium tin oxide, silicon carbide, calcium fluoride, cadmium telluride, zinc sulfide, zinc selenide, titanium dioxide, indium phosphide, indium antimonide, gallium nitride, silicon germanium, sapphire, gallium arsenide, epitaxial silicon, poly-silicon, gate oxide, silicon dioxide, other glasses, and combinations thereof. Additional materials useful for the manufacture of a patterned template in accordance with the present invention can include polymeric materials, including without limitation polydimethylsiloxane (PDMS),polymethyl methacrylate (PMMA), polycarbonate, and other polymers, singly or in combination with other materials, including materials listed herein.

The patterned surface 12 and/or the integrated mask 14 of template 10 can be manufactured using various processes including, but not limited to, optical lithography, electron beam lithography, ion-beam lithography, x-ray lithography, extreme ultraviolet lithography, scanning probe lithography, focused ion beam milling, interferometric lithography, epitaxial growth, thin film deposition, wet chemical etch, plasma etch, ion milling, reactive ion etch, laser direct writing, grayscale lithography, binary lithography, thermal reflow, mass transport, micromachining the material of the template form, direct electron beam writing, conventional holographic lithography, computer generated near field holography, laser ablation, diamond turning, mechanical ruling, fly wheel cutting, free form surface micromachining, and the like, and combinations thereof. Reference is made, for example, to Suleski, et al., *Optics Letters*, Vol. 24, No. 9, May 1, 1999, pages 602-604; Suleski, et al., *Micromachining Technology for Micro-Optics and Nano-Optics III*, vol. 5720, E. G. Johnson, G. P. Nordin, and T. J. Suleski, Eds.: Proc SPIE, 2005, pp. 86-93; and M. A. Davies, et al., *Lithographic and Micromachining Techniques for Optical Component Fabrication II*, vol. 5183, E. B. Kley and H. P. Herzig, Eds.: Proc SPIE, 2003, pp. 94-108; D. C. O'Shea, T. J. Suleski, A. D. Kathman, and D. W. Prather, *Diffractive Optics: Design, Fabrication, and Test*. Bellingham: SPIE Press, 2003; T. J. Suleski and R. D. Te Kolste, "Fabrication trends in free-space micro-optics," *J. Lightwave. Tech.*, vol. 23, pp. 635-646, 2005; T. J. Suleski, "Diffractive Optics Fabrication," in *Encyclopedia of Optical Engineering*, R. G. Driggers, Ed. New York: Marcel Dekker, 2003, pp. 374-387; S. Sinzinger and J. Jahns, *Microoptics*. Weinheim, Germany: Wiley-VCH, 1999; M. Kufner and S. Kufner, *Micro-optics and lithography*, Brussels, Belgium: VUB Press, 1997; H. P. Herzig (ed.), *Micro-optics: Elements, systems, and applications*. London: Taylor and Francis, 1997; P. Rai-Choudhury (ed.), *Handbook of Microlithography, Micromachining, and Microfabrication*, (SPIE Press, Bellingham, Wash., 1997); J. R. Sheats and B. W. Smith (eds.), *Microlithography Science and Technology*, (Marcel Dekker, New York, 1998); H. J. Levinson, *Principles of Lithography* (SPIE Press, Bellingham, 2001); and M. J. Madou, *Fundamentals of Microfabrication: The Science of Miniaturization*, 2nd ed. (CRC Press LLC, Boca Raton, 2002).

The present invention further includes a method of creating shaped structures. FIGS. 2A and 2B schematically illustrate exemplary embodiments in accordance with this aspect of the invention.

Turning first to FIG. 2A, the method of the present invention can include positioning a patterned surface of a template (also referred to herein as a form mold), such as patterned surface 12 of patterned template 10 illustrated in FIG. 1, in proximity to a surface 30 of an object 32 on which a structure is to be formed. The object 32 on which the structure is to be formed can be any substrate suitable for the fabrication of shaped devices, including without limitation semiconductor materials such as quartz, silicon, indium tin oxide, silicon carbide, calcium fluoride, cadmium telluride, zinc sulfide, zinc selenide, titanium dioxide, indium phosphide, indium antimonide, gallium nitride, silicon germanium, sapphire, gallium arsenide, epitaxial silicon, poly-silicon, gate oxide, silicon dioxide, other glasses, and combinations thereof. Additional materials useful for the manufacture of object 32 in accordance with the present invention can include polymeric materials, including without limitation polydimethylsiloxane (PDMS),polymethyl methacrylate (PMMA), polycarbonate, and other polymers, singly or in combination with other materials, including materials listed herein.

The distance between patterned surface 12 of patterned template 10 and surface 30 of the object on which the structure is to be built can vary, and may depend at least in part upon the particular requirements of a given device. In certain embodiments, the method can include positioning the patterned template 10 at a distance from the surface 30 such that the space between the template 10 and the surface 30 is substantially the same as the desired thickness of the desired structure.

The method further includes substantially filling a space between surface 32 of object 30 on which the structure is to be formed and patterned surface 12 with a radiation sensitive material, designated in FIG. 2A at 34. In an exemplary embodiment, the step of substantially filling the space between the patterned template and the object surface may include applying radiation sensitive material to the surface of the object on which the structure is to be formed. In a complementary embodiment, the step of substantially filling the space may include applying the radiation sensitive material to the patterned surface of the template. In yet another complementary embodiment, the step of substantially filling the space may include directing a gaseous form of the radiation sensitive material into the space. More than one of the techniques for filling the space may also be utilized concurrently.

As used herein, the term "radiation sensitive material" refers to any material capable of undergoing a physical and/or chemical change when subjected to or exposed to activating radiation. As used herein "activating radiation" refers to radiation that may affect a physical and/or chemical change. Activating radiation may include ultraviolet light (e.g., light having a wavelength between about 157 nm to about 450 nm), actinic light, visible light, infrared light, extreme ultraviolet light and x-rays. Generally, any wavelength of light capable of affecting a physical and/or chemical change may be classified as activating.

Exemplary physical and/or chemical changes may include one or more of crosslinking, polymerization, depolymerization, other chemical reactions, swelling, shrinking, color changes, solidification, growth, deposition, refractive index changes, ablation, sublimation, laser assisted chemical vapor deposition, 2 photon processes, femtosecond laser processing, and the like, and combinations thereof. This list of changes is representative only and should not be interpreted as limiting the physical or chemical changes that may occur in a radiation sensitive material.

Radiation sensitive materials useful in the present invention are well known in the art and are commercially available. The radiation sensitive materials may include, but are not limited to, at least one or more of monomers, oligomers, polymers, prepolymers, resinous materials, optionally dispersed or dissolved in a suitable solvent that is copolymerizable therewith, which are photopolymerizable when exposed to a source of radiation (ultraviolet or UV radiation, or radiation outside the UV spectrum). Exemplary radiation sensitive materials useful in the present invention can include without limitation ethylenically unsaturated materials, such as reactive acrylic monomers, including acrylic and methacrylic acids, and their amides, esters, salts and corresponding nitriles; silylated agents such as silylated monomers including a silicon group; dimethyl siloxane derivatives; phenolic compounds; epoxy compounds; and the like, as well as various metallic compounds, ceramics, dielectrics, semiconductor materials, solgels, chemical precursors capable of additive growth (such as but not limited to reactive species capable of being grown in a guided manner using laser light), and the like, as well as combinations thereof. Accordingly, radiation sensitive materials useful in the invention include materials that can be used in additive processes, subtractive processes, and/or combinations thereof. In addition, at least one or more radiation sensitive materials can be used in the invention (for example, at least one or more different reactive species capable of reacting when exposed to radiation to form the devices as described herein).

The form of the radiation sensitive material can vary, and in exemplary embodiments of the invention, as indicated above, the radiation sensitive materials can be in the form of a vapor or gas directed between the respective surfaces, or in the form of a liquid or solid materials applied on one or more of the surfaces of the template 10 and/or object 32.

In exemplary embodiments of the invention, the radiation sensitive material can be a curable low viscosity liquid monomer solution. A suitable solution may have a viscosity ranging from about 0.01 cps to about 100 cps (measured at 25° C.), although as will be appreciated by the skilled artisan, materials having a viscosity outside of this range can also be used in the invention. Low viscosities can be useful for high-resolution structures. In this embodiment of the invention, the curable liquid may be composed of a variety of photopolymerizable materials, generally combined with one or more suitable photoinitiators. In some embodiments, the curable liquid may include one or more commercially available negative photoresist materials or epoxies. The viscosity of the photoresist material may be reduced by diluting the liquid photoresist with a suitable solvent.

The radiation sensitive material can be functionalized, i.e., can include at least one or more functional elements incorporated into the material. Functionalized radiation sensitive materials can be useful in the invention to provide additional properties to the resultant device. Functionalized materials useful in the present invention can include, for example, nanocomposite materials including a host material or matrix such as a radiation sensitive material as described herein further containing additional component(s) such as but not limited to quantum dots, nanocrystals, nanoparticles, microspheres, nanospheres, functionalized particles, and combinations thereof. These materials can be useful for imparting specific sensing functions, light generation functions, and/or non-linear optical properties, magnetic and/or structural and/or thermal and/or biological and/or chemical and/or reactive characteristics. Other functionalized materials useful in the invention include prepolymers and/or polymeric materials including at least one or more functional groups incorporated into the polymer structure. These and other functionalized radiation sensitive materials are known in the art and are commercially available.

In the invention, radiation can be directed toward the patterned template 10 and/or the object 32 in a manner selected to create a radiation interference pattern. Generally, as indicated above, the radiation is activating radiation, i.e., includes electromagnetic radiation that can produce photochemical reactions. FIG. 2A illustrates directing substantially collimated beams 36 of activating radiation toward and through the patterned template 10, which can be formed of a material that is substantially transparent to the transmission of radiation. The present invention, however, is not so limited, and in alternative embodiments, the activating radiation can be directed toward and/or through the object 32. In those embodiments in which the radiation is directed through the object 32, the object is typically formed of a suitable material that is substantially transparent to the transmission of radiation. In each embodiment the activating radiation may be collimated, converging, diverging, or combinations thereof.

As also illustrated in FIG. 2A, the patterned template 10 can include an integrated mask 14 selected to create a radiation interference pattern 38 when radiation passes therethrough. As discussed above, the integrated mask can be any of the types of masks known in the art useful for creating a radiation interference patterns, such as but not limited to phase masks, amplitude masks, and combination thereof. As also discussed herein, the invention is not limited to the creation of a radiation interference pattern, and accordingly the invention can include other means for manipulating and/or segmenting radiation patterns.

Alternatively, as illustrated in FIG. 2B, the method may employ a patterned template 10' having at least a first patterned surface 12', such as surface 12 of patterned template 10 described herein. In this embodiment of the invention, however, the patterned template 10' does not require an integrated mask for creating the desired interference pattern. In this embodiment of the invention, at least one, or more, light beams 36' can be directed toward the mold and/or toward the underlying object 32' in a manner sufficient to create a desired interference pattern 38' produced by the interference of the light beams 36'. For example, a radiation source, such as a laser beam, can be split into two or more coherent beams using one or more of suitable splitting devices such as gratings, beam splitters, and the like. The beams can be expanded and/or manipulated to overlap to form the desired interference pattern. See also, for example, Dario Gil et al., *J.Vac-.Sci.Technol.* B21(6), November/December 2003, pp. 2810-2814; and M. Campbell, D. N. Sharp, M. T. Harrison, R. G. Denning, and A. J. Tuberfield, "Fabrication of photonic crystals for the visible spectrum by holographic lithography," *Nature*, vol. 404, pp. 53-56, 2000. It is noted that these references do not teach surface shaping performed with a mold surface.

In yet another alternative embodiment, a suitable material that is substantially transparent to the transmission of radiation therethrough, and also is capable of increasing fabrication resolution in an amount equal to the index of refraction of the material, can be used. In this embodiment of the invention, a suitable material such as a polymer, for example but not limited to PDMS, can be positioned between the radiation source and the radiation sensitive material so that the radiation sensitive material is exposed to the radiation through the PDMS. In this embodiment, interference patterns formed in the material can exhibit an increase in fabrication resolution equal to the index of refraction of the PDMS (or other material).

Returning to FIG. 2B, in the illustrated embodiment, in which the radiation passes through the template 10', the template is typically formed of a suitable material that is substantially transparent to the transmission of radiation. Again, however, the present invention, however, is not so limited, and in alternative embodiments, the activating radiation can be directed toward and/or through the object 32', in which embodiments object 32' is typically formed of a suitable material that is substantially transparent to the transmission of radiation. In this case, it is also possible that there is an integrated mask on a top surface and the light directed through the object reflects off of the integrated mask (which could be coated with a reflective material) such that the reflected light from the integrated mask creates an interference pattern in the volume.

In the method, the radiation sensitive material is exposed to the radiation interference pattern 38 or 38' to effect a chemical and/or physical change within the radiation sensitive material. In addition, exposing the radiation sensitive material to the radiation interference pattern also forms at least a first pattern in the radiation sensitive material corresponding to the radiation interference pattern.

The dimensions of the resultant pattern imparted to the material can vary, depending upon the particular requirements of a given application. As a non-limiting example, template 10 can include an integrated mask dimensioned to impart a particular scaled pattern to the material which has undergone a chemical and/or physical change as described herein; as another non-limiting example, when using a template without an integrated mask, such as template 10', the radiation interference pattern can also be created so as to impart a particular scaled pattern to the material which has undergone a chemical and/or physical change as described herein. The resultant structure can accordingly include at least one of nano-sized patterns, micro-sized patterns, milli-sized patterns, and/or macro-sized patterns, depending upon the particulars of the radiation interference pattern created in accordance with the present invention. The invention can be particularly useful for the production of structures including micro- and nano-sized patterns incorporated therein.

As discussed above, the radiation sensitive material may contact patterned surface 12 or 12' of patterned template 10 or 10', respectively. Where the radiation sensitive material contacts the patterned surface of the form mold, the exposing step may form at least a second pattern in the radiation sensitive material from the contact between the radiation sensitive material and the patterned surface of the form mold, resulting in a shaped surface on the structure. In this manner, the radiation sensitive materials can be acted upon to effect a chemical and/or physical change as discussed herein to form structures complementary to the pattern on the template surface 12 or 12'.

Similar to the dimensions of the resultant pattern imparted to the material subjected to a chemical and/or physical change as discussed herein via the radiation interference pattern, the surface pattern imparted to the structure from the patterned surface of the template can also vary, depending upon the particular requirements of a given application. As a non-limiting example, template 10 or 10' can include a surface pattern 12 or 12' including features dimensioned to impart the desired scaled pattern to the material subjected to a chemical and/or physical change as discussed herein. The resultant surface structure can accordingly include at least one of nano-sized patterns, micro-sized patterns, milli-sized patterns, and/ or macro-sized patterns, imparted thereto from contact with the patterned surface of the template, depending upon the particulars of the dimensions of the features of the patterned surface.

The active energy beams used in accordance with the present invention may be, for example, visible light, ultraviolet light, infrared light, extreme ultraviolet light, x-rays, or a combination thereof. The polymerization may be activated by irradiating the composition with ultraviolet light using any of the techniques known in the art for providing ultraviolet radiation, i.e., in the range of about 157 nm to about 450 nm ultraviolet radiation, or by irradiating the composition with radiation outside of the ultraviolet spectrum. The radiation may be natural or artificial, monochromatic or polychromatic, incoherent, partially coherent, or coherent and should be sufficiently intense to activate the chemical and/or physical change in the radiation sensitive materials (for example, to effect polymerization). Conventional radiation sources include fluorescent lamps, mercury, metal additive and arc lamps. Coherent light sources include pulsed or continuous nitrogen, xenon, argon ion- and ionized neon lasers, or other gas lasers, and/or solid-state lasers including, for example, Nd:YAG or Titanium-sapphire lasers whose emissions, or resulting emissions from N-photon processes (where N=2 or more), fall within or overlap the absorption bands of the radiation sensitive materials of the invention.

The method may further include the step of removing the form mold after the exposing step. In this embodiment, the patterned surface of the form mold may be coated with a release coating to more effectively execute the step of removing the form mold. Exemplary release coatings can include fluorinated compounds.

After the physical and/or chemical change is substantially effected in the radiation sensitive material, the resulting structure, designated generally as 40 and 40' in FIGS. 2A and 2B, respectively, typically will include internal features selected from one or more of 1-dimensional, 2-dimensional, and 3-dimensional features, which internal features can be formed by exposure to the radiation pattern. Stated differently, the resultant structures typically include at least one of a 1-, 2-, or 3-dimensional internal structure. In addition, the structures of the invention can have a shaped surface, such as can be formed when the patterned surface of the form mold is in contact with the radiation sensitive material. The pattern imparted to the structures 40 or 40' by the radiation pattern and the patterned surface of the structures 40 or 40' resulting from contact with the patterned surface of the template can have varying dimensions, as discussed herein, including nano-, milli-, micro- and/or macro-scaled dimensions.

The resultant structures 40 or 40' can further be used as a template for the creation of additional downstream products. For example, the method of the invention may further include the step of back-filling the resultant structure 40 or 40' having a 1-, 2- or 3-dimensional internal structure with a substance having a different solubility than the material forming the structure 40 or 40'. After backfilling the structure 40 or 40', the radiation sensitive material may be removed, resulting in a second structure, which can be 1-, 2-, or 3-dimensional, formed of the substance having a different solubility than the original structure 40 or 40'. Suitable back-filling materials may include one or more of polymers, metals, semiconductors, dielectric materials, and the like, and combinations thereof, so long as the back-filling materials possess different solubility characteristics than the radiation sensitive material. Non-limiting examples of suitable back-filling materials include silver, gold, copper, tungsten, alumina, gallium, bismuth, indium, silicon, titanium dioxide, gallium nitride, gallium arsenide, zinc oxide, and the like and combinations thereof.

In other alternative embodiments, the method of the invention may further include the step of back-filling the resultant structure 40 or 40' having a 1-, 2- or 3-dimensional internal structure with a material capable of imparting an additional functionality to the resultant structure, for example, liquid crystal or other electro-optical and/or magneto-optical materials. Such materials can impart active functionality to the resultant devices. The resultant structure can also be back-filled with other suitable materials such as materials having a higher index to provide better contrast (e.g., for photonic bandgap). Additional non-limiting examples of suitable backfilled materials include sol-gels, liquid crystals, electrochromic materials, photochromic materials, electro-optical materials, and the like and combinations thereof.

The method may further include the additional step of removing some or all of any radiation sensitive material, exposed or unexposed to the radiation pattern, before or after removal of the form mold. The skilled artisan will appreciate that negative acting radiation sensitive materials can include materials that can polymerize upon exposure to radiation so that the polymerized material remains following subsequent development. In this embodiment, the removal step can include removing negative acting radiation sensitive material that is not exposed to the activating radiation. Similarly, the skilled artisan will appreciate that positive acting radiation sensitive materials can include materials having bonds (such as chemical bonds, including bonds in a polymer backbone, etc.) that are broken upon exposure to radiation so that the material can be removed upon subsequent development. In this embodiment, the removal step can include removing positive radiation sensitive material that has been exposed to activating radiation. The step of removing some or all of radiation material can be conducted using known processes.

In another aspect, the invention is a method of creating 1-dimensional, 2-dimensional, and/or 3-dimensional structures. The method includes directing actinic radiation through a mask, such as a phase mask or an amplitude mask or combinations thereof, to create an interference pattern. The interference pattern may then be directed into a radiation sensitive material to effect a chemical or physical change. The step of directing the interference pattern into the radiation sensitive material typically results in an internal 1-, 2-, or 3-dimensional structure. Those having ordinary skill in the art will recognize the techniques and methods for forming such structures by utilizing interference patterns.

The method further includes removing the mask from the radiation sensitive material after formation of the internal structure. The surface of the radiation sensitive material may then be etched to form a desired pattern, either repeating or non-repeating, on the surface of the radiation sensitive material.

Figure 3A:
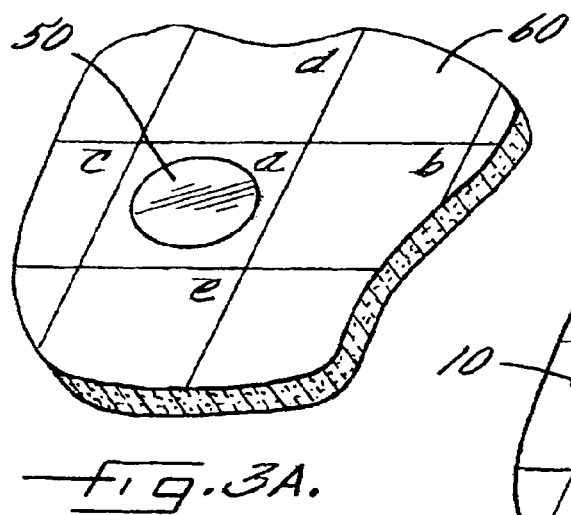

Turning now to FIGS. 3A-D, the invention can also include a scalable method of fabricating a plurality of shaped structures. In this aspect of the invention, as illustrated in FIG. 3A, the method may include dispensing a radiation sensitive material 50, such as described above, onto a growth surface 60. In this aspect of the invention, the radiation sensitive material can be a low viscosity prepolymer, although any of the radiation sensitive materials described herein, including gaseous radiation sensitive materials, can also be useful in this aspect of the invention. Accordingly, the term "dispensed" as used herein is not limited to the application of a liquid material to the growth surface but also includes any suitable means for positioning the radiation sensitive material as desired for a particular application.

As used herein, the term "growth surface" shall be understood to include the surface on which fabrication occurs. The growth surface can be the surface of a suitable substrate onto which device fabrication is conducted, such as but not limited to quartz, silicon, indium tin oxide, silicon carbide, calcium fluoride, cadmium telluride, zinc sulfide, zinc selenide, titanium dioxide, indium phosphide, indium antimonide, gallium nitride, silicon germanium, sapphire, gallium arsenide, epitaxial silicon, poly-silicon, gate oxide, silicon dioxide, other glasses, and combinations thereof. Additional materials useful for the substrate can include polymeric materials, including without limitation polydimethylsiloxane (PDMS), polymethyl methacrylate (PMMA), polycarbonate, and other polymers, singly or in combination with other materials, including materials listed herein.

As illustrated in FIG. 3A, the growth surface can be divided into a plurality of sectors or regions, such as regions a, b, c, d, e, etc. In the embodiment illustrated in FIG. 3A, the radiation sensitive material can be directed to an area proximate a particular region or sector of the substrate surface. For example, a liquid radiation sensitive material can be deposited on the substrate surface substantially within the boundaries of at least one of the regions, for example region "a" as illustrated. The radiation sensitive material can be applied using any suitable technique for the deposition of the radiation sensitive materials, such as spin coating, drop dispensing, and the like. See for example, Y. Xu, et al., *J.Microlith. Microfab., Microsyst.*, vol. 3, pp. 168-173 (2004). As discussed below, the present invention is not so limited, and accordingly, at least one, two or more droplets of a radiation sensitive material can be concurrently deposited in one or more corresponding regions a, b, c, d, e, etc.

As also indicated herein, the invention is not limited to the use of liquid radiation sensitive materials. Accordingly, other dispensing techniques may be employed, depending upon the nature and form of the material to be exposed to radiation. For example, other techniques may be used when the radiation sensitive material is a gaseous material to direct the gaseous material into a region proximate the growth surface.

Figure 3B:
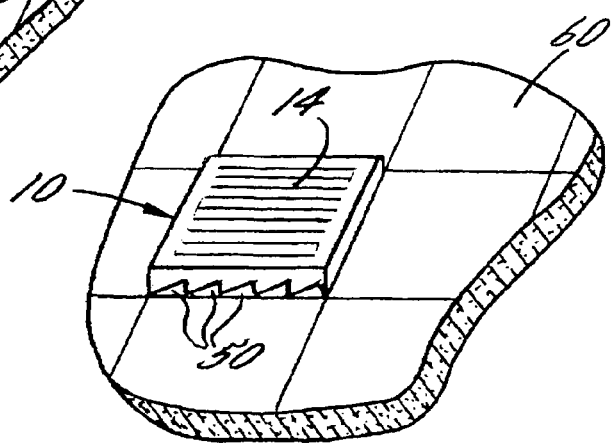

As illustrated in FIG. 3B, in this aspect of the invention, a form mold, such as the patterned template 10 or 10' described herein, having at least one first patterned surface 12 or 12', respectively, can be positioned relative to the growth surface 60 so as to position the radiation sensitive material 50 between the patterned surface and the growth surface and further so that the patterned surface is facing the radiation sensitive material. FIG. 3B illustrates the use of a patterned template 10 including an integrated mask 14, but the present invention is not so limited, and in alternative embodiments, the patterned template may not include an integrated mask, such as template 10' as illustrated in FIG. 2B.

Figure 3C:
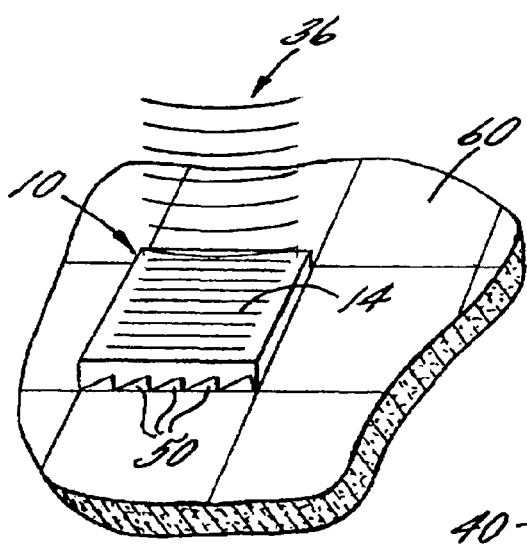

After positioning the patterned template 10, as illustrated in FIG. 3C, radiation 36 is typically directed toward the mask in a manner selected to create a radiation pattern, such as the radiation interference pattern 38 illustrated in FIG. 2A, and to initiate a reaction of the radiation sensitive material to effect a chemical and/or physical change in the radiation sensitive material, such as described above. As discussed herein, however, the radiation may be directed through the substrate on which the structures are fabricated.

Figure 3D:
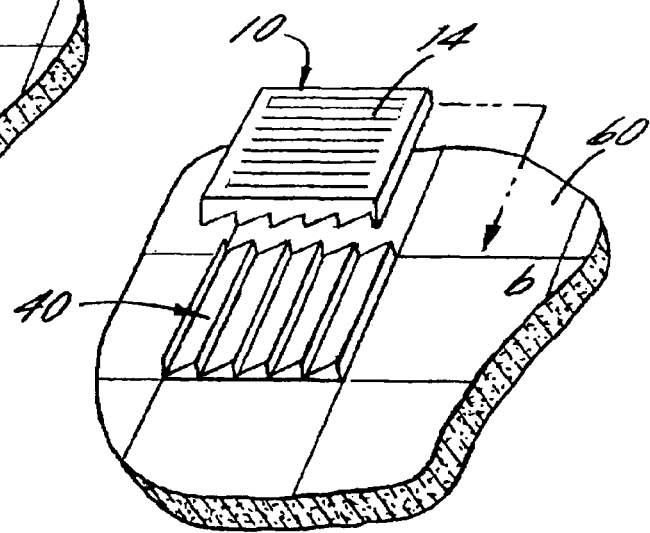

As illustrated in FIG. 3D, the patterned template 10 may then be removed from the radiation sensitive material, which can now be in the form of a solidified product 40, and moved to a different position, such as any of the regions b, c, d, e, etc. with respect to the growth surface 60.

The method further includes repeating each of the previous steps at least one time. In one embodiment, the method includes repeating each of the previous steps until fabrication has been conducted across substantially all of the growth surface 60. In another embodiment, the method includes repeating each of the previous steps until fabrication has been conducted throughout a designated area of the growth surface 60.

The radiation sensitive material may be dispensed onto a location of growth surface 60 proximate (i.e., at or near) a location at which the fabrication is to be conducted. Stated differently, the radiation sensitive material can be dispensed using a series of steps. The dispensing location may be approximate, rather than specific, as the radiation sensitive material may migrate to cover adjacent locations. Alternatively, the radiation sensitive material may be dispensed across substantially all of the growth surface 60 upon which fabrication is to be conducted in one dispensing step. In yet another alternative, the radiation sensitive material may be dispensed one time across the growth area 60, one time for each repetition of fabrication in the scalable method, or some combination of the two methods. Stated differently, the radiation sensitive material may be dispensed over more than one fabrication location but less than the entire growth surface at one time.

In this manner, the method can provide one or more discrete structures fabricated on the growth surface 60. The discrete structures can be separated from one another to provide a plurality of individual devices. The resultant product can include structure 40 by itself after release from the growth surface, or structure 40 still on the growth surface (wafer) after the wafer is diced/separated. Any suitable separation techniques can be used, including without limitation dicing, singulation, scribing and breaking, and the like, as well as combinations thereof. It is further noted that the invention can include the use of a template or form mold containing one or more copies of a device pattern (which can be the same or different), which can be used in the manner described herein to pattern the devices onto a growth surface. The resulting multiple copies of the devices fabricated on the growth surface can then be singulated and/or diced. Accordingly, a single template could potentially include more than one, for example a plurality of, for example up to 10 s, and for example up to 1000 s of, copies of a mold/mask pattern(s) that are all patterned in parallel onto a growth surface, then diced and/or singulated.

FIG. 4 illustrates in cross section an exemplary product in accordance with another aspect of the invention. In particular, FIG. 4 illustrates a structure 70 including at least one shaped surface 74. The structure 70 further includes at least one of a 1-, 2- or 3-dimensionally shaped pattern 72, within and/or throughout the volume of the structure 70, such as the three dimensional lattice pattern 72 indicated by the greatly enlarged section of FIG. 5. The present invention can allow flexibility in selecting the desired scale of dimensions of a product. For example, the three dimensional pattern 72 can include a pattern having milliscale features, microscale features, nanoscale features, or macroscale features, or may have combinations of milliscale, microscale, nanoscale and/or macroscale features. Similarly, the patterned surface 74 can include a pattern having milliscale features, microscale features, nanoscale features, or macroscale features, or may have combinations of milliscale, microscale, nanoscale and/or macroscale features. As also depicted in FIG. 5, the structure 70 may further include functional components 76 embedded in the three dimensional pattern 72, including but not limited to any of the types of functionalized particles described herein.

The present invention can allow the production of a variety of products useful in various applications, including without limitation optics, photonics, energy, biomedical, and the like. The invention can be useful, for example, for the fabrication of optical devices formed of materials having desired light emitting properties. The present invention is not so limited, however, to the production of optical devices and can also useful for the fabrication of structures having desired structural or mechanical properties. Non-limiting examples of structures that can be fabricated in accordance with the present invention include light emitting devices, tissue scaffolds, electrodes, drug delivery vehicles, and the like. The present invention is not limited to the recited structures and can be useful in the fabrication of any of the types of structures in which the ability to provide variances of scale of internal and surface patterns as described herein would be useful. Additional non-limiting examples include structures designed to facilitate the flow of a gas and/or a liquid through the structure; photonic crystals; superprisms; structures that alter the dispersion properties of transmitted electromagnetic radiation; optical sensors; chemical sensors; biological sensors; pressure sensors; thermal sensors; optical transmission filters; particle filters; fuel cells; reactive catalysts; integrated fluid filters and mixers; biologically functionalized materials; and the like. Additional non-limiting examples of the types of devices that can be fabricated in accordance with the invention can include without limitation diffractive optical structures associated with a template surface, such as but not limited to gratings, computer generated holograms, beam shapers, beam splitters, beam conditioners, wavefront shapers, and the like; refractive optical structures associated with a template surface, such as but not limited to lenses, beam shapers, prisms, and the like; mechanical structures associated with a template surface, such as but not limited to alignment fixtures or features, connectors for optical fibers, pieces of tubing (for flow of light, liquid or gas), and the like; and combinations thereof.

In the specification, drawings, and examples, there have been disclosed typical embodiments of the invention and, although specific terms have been employed, they have been used in a generic and descriptive sense only and not for purposes of limitation, the scope of the invention being set forth in the following claims.

That which is claimed is:

1. A method of fabricating shaped structures, the method comprising:
   positioning a patterned surface of a form mold in proximity to a surface of an object on which a structure is to be formed;
   substantially filling a space between the object on which the structure is to be formed and the patterned surface with a gaseous form of a radiation sensitive material;
   creating a radiation interference pattern formed by the interference of radiation beams in different planes; and
   exposing the radiation sensitive material to the radiation interference pattern to effect a chemical change, a physical change, or both a chemical and a physical change within the radiation sensitive material and to form at least a first pattern within the volume of the radiation sensitive material corresponding to the radiation interference pattern.

2. A method according to claim 1, wherein the step of exposing the radiation sensitive material to the radiation interference pattern to effect a chemical change, a physical change or both a chemical and a physical change within the radiation sensitive material comprises exposing the radiation sensitive material to a radiation interference pattern designed to form a nanostructure.

3. A method according to claim 1, wherein the step of exposing the radiation sensitive material to the radiation interference pattern to effect a chemical change, a physical change or both a chemical and a physical change within the radiation sensitive material comprises exposing the radiation sensitive material to a radiation interference pattern designed to form a microstructure.

4. A method according to claim 1, further comprising contacting the radiation sensitive material with said patterned surface of the form mold to form at least a second pattern in a surface of the radiation sensitive material corresponding to the patterned surface of the form mold.

5. A method according to claim 4, further comprising the step of removing the form mold after said exposing step.

6. A method according to claim 5, further comprising coating the patterned surface of the form mold with a release coating to more effectively execute the step of removing the form mold.

7. A method according to claim 4, wherein said creating step comprises creating a radiation interference pattern to form a nano-scale pattern, a milli- scale pattern, or a micro-scale pattern within the volume of the radiation sensitive material and wherein said contacting step comprises contacting the radiation sensitive material with the patterned surface of the form mold to form a nano-scale pattern, a milli-scale pattern, or a micro-scale pattern in the surface of the radiation sensitive material.

8. A method according to claim 7, wherein the pattern within the volume of the radiation sensitive material and the pattern in the surface of the radiation sensitive material have the same scale.

9. A method according to claim 7, wherein the pattern within the volume of the radiation sensitive material and the pattern in the surface of the radiation sensitive material have different scales.

10. A method according to claim 4, further comprising exposing the radiation sensitive material to the radiation interference pattern to effect a chemical change, a physical change, or both a chemical and a physical change within the radiation sensitive material and to form at least a first pattern within the volume of the radiation sensitive material corresponding to the radiation interference pattern and contacting the radiation sensitive material with the patterned surface of the form mold to form at least a second pattern in a surface of the radiation sensitive material corresponding to the patterned surface of the form mold at the same time.

11. A method according to claim 1, wherein the step of substantially filling the space comprises applying the radiation sensitive material to a surface of the object on which the structure is to be formed.

12. A method according to claim 1, wherein the step of substantially filling the space comprises applying the radiation sensitive material to the patterned surface of the form mold.

13. A method according to claim 1, wherein the form mold further includes an integrated mask, and wherein the step of creating a radiation interference pattern comprises directing radiation through the integrated mask.

14. A method according to claim 13, wherein the integrated mask comprises at least one mask selected from the group consisting of integrated phase masks, integrated amplitude masks, and combinations thereof.

15. A method according to claim 1, wherein the step of creating a radiation interference pattern comprises directing at least one or more beams of radiation toward the form mold in a manner sufficient to create the radiation interference pattern.

16. A method according to claim 15, wherein the radiation is directed through the form mold.

17. A method according to claim 15, wherein the radiation is directed through the object on which the structure is to be formed.

18. A method according to claim 1, wherein the step of positioning the form mold comprises positioning the form mold at a distance from the object such that the space between the form mold and the object is substantially the same as the desired thickness of the desired structure.

19. A method according to claim 1, wherein the step of substantially filling a space between the object on which the structure is to be formed and the patterned surface of the form mold comprises filling the space with a radiation sensitive material.

20. A method according to claim 1, wherein the step of substantially filling a space between the object on which the structure is to be formed and the patterned surface of the form mold with a radiation sensitive material comprises filling the space with a photopolymerizable material, and wherein the step of effecting a chemical change, a physical change or both a chemical and a physical change within the radiation sensitive material comprises effecting a photopolymerization reaction within the photopolymerizable material.

21. A method according to claim 20, further comprising the step of removing photopolymerizable material unexposed to the radiation interference pattern.

22. A method according to claim 1, wherein the step of substantially filling a space between the object on which the structure is to be formed and the patterned surface of the form mold with a radiation sensitive material comprises filling the space with a material comprising bonds that break upon exposure to radiation, and wherein the step of effecting a chemical, a physical change or both a chemical and a physical change within the radiation sensitive material comprises breaking bonds of the radiation sensitive material.

23. A method according to claim 22, further comprising the step of removing radiation sensitive material exposed to the radiation interference pattern.

24. A method according to claim 1, wherein the step of effecting a chemical change, a physical change or both a chemical and a physical change within the radiation sensitive material comprises solidifying the radiation sensitive material to form a solidified material comprising at least one feature selected from the group consisting of one- dimensional features, two-dimensional features, and three-dimensional features.

25. A method according to claim 24, further comprising the step of back-filling the solidified material with a material having a different solubility than the solidified material.

26. A method according to claim 25, further comprising the step of dissolving the solidified material to achieve a structure formed of the material having a different solubility than the solidified material.

27. A method according to claim 1, wherein the step of substantially filling a space between the object on which the structure is to be formed and the patterned surface with a radiation sensitive material comprises filling the space with a functionalized radiation sensitive material.

28. A method according to claim 27, wherein the functionalized radiation sensitive material comprises at least one nanocomposite material.

29. A method according to claim 28, wherein said at least one nanocomposite material comprises at least one material selected from the group consisting of quantum dots, nanocrystals, nanoparticles, microspheres, nanospheres, functionalized particles, and combinations thereof.

30. A method according to claim 1, wherein the step of creating a radiation interference pattern formed by the interference of radiation beams in different planes creates a radiation interference pattern with variation in a direction parallel to the surface of the object on which the structure is to be formed and variation within the radiation sensitive material in a direction perpendicular to the surface of the object on the structure is to be formed.

31. A scalable method of fabricating shaped structures, the method comprising:
 directing a gaseous form of a radiation sensitive material onto or in proximity to a growth surface;
 positioning a form mold comprising a first patterned surface so that the patterned surface is facing the radiation sensitive material;
 creating a radiation interference pattern formed by the interference of radiation beams in different planes;
 exposing the radiation sensitive material to the radiation interference pattern to effect a chemical change, a physical change, or both a chemical change and a physical change in the radiation sensitive material to form a discrete internal structure within the volume of the radiation sensitive material having a pattern corresponding to the radiation interference pattern;
 moving the form mold to a different position on the growth surface; and
 repeating each of the previous steps at least one time to create at least two or more discrete internal structures within the volume of the radiation sensitive material across at least a portion of the growth surface.

32. A method according to claim 31, further comprising contacting the radiation sensitive material with said patterned surface of the form mold to form at least a second pattern in the surface of the radiation sensitive material corresponding to the patterned surface of the form mold.

33. A method according to claim 32, wherein said creating step comprises creating a radiation pattern to form the internal structure within the volume of the radiation sensitive material with a nano-scale pattern, a milli-scale pattern, or a micro- scale pattern, and wherein said contacting step comprises contacting the radiation sensitive material with the patterned surface of the form mold to form a nano-scale pattern, a milli- scale pattern, or a micro-scale pattern in the surface of the radiation sensitive material.

34. A method according to claim 33, wherein the internal structure within the volume of the radiation sensitive material and the pattern in the surface of the radiation sensitive material both have the same scale pattern.

35. A method according to claim 33, wherein the internal structure within the volume of the radiation sensitive material and the pattern in the surface of the radiation sensitive material have different scale patterns.

36. A method according to claim 32, wherein said repeating step further comprises repeating said contacting step to create a pattern in the surface of the radiation sensitive material at a different position on the growth surface.

37. A method according to claim 32, further comprising exposing the radiation sensitive material to the radiation interference pattern to effect a chemical change, a physical change, or both a chemical and a physical change within the radiation sensitive material and to form at least a first pattern within the volume of the radiation sensitive material corresponding to the radiation interference pattern and contacting the radiation sensitive material with the patterned surface of the form mold to form at least a second pattern in a surface of the radiation sensitive material corresponding to the patterned surface of the form mold at the same time.

38. A method according to claim 31, wherein the step of directing a radiation sensitive material comprises dispensing the radiation sensitive material in a location on the growth surface at which the fabrication is to be carried out.

39. A method according to claim 31, wherein the step of directing a radiation sensitive material comprises dispensing the radiation sensitive material across substantially all of the growth surface.

40. A method according to claim 31, wherein said form mold further comprises an integrated mask and wherein the step of creating a radiation interference pattern comprises directing radiation through the integrated mask.

41. A method according to claim 31, further comprising coating the patterned surface of the form mold with a release coating prior to said positioning step.

42. A method according to claim 31, wherein the step of repeating each of the previous steps at least one time comprises repeating each of the previous steps until fabrication has been conducted across substantially all of the growth surface.

43. A method according to claim 31, wherein the step of repeating each of the previous steps at least one time comprises repeating each of the previous steps until fabrication has been conducted throughout a designated area of the growth surface.

44. A method according to claim 31, further comprising the step of separating said at least two or more discrete structures.

45. A method according to claim 31, wherein the step of creating a radiation interference pattern formed by the interference of radiation beams in different planes creates a radiation interference pattern with variation in a direction parallel to the surface of the object on which the structure is to be formed and variation within the radiation sensitive material in a direction perpendicular to the surface of the object on the structure is to be formed.

46. A method of fabricating shaped structures having a shaped surface and an internal structure within the volume of the article, the method comprising:
   directing a gaseous form of a radiation sensitive material onto or in proximity to a growth surface;
   contacting the radiation sensitive material with a patterned surface of a form mold to form a shaped surface having a pattern corresponding to the patterned surface of the form mold;
   creating a radiation interference pattern formed by the interference of radiation beams in different planes; and
   exposing the radiation sensitive material to the radiation interference pattern to effect a chemical change, a physical change, or both a chemical change and a physical change in the radiation sensitive material to form an internal structure corresponding to the radiation interference pattern within the volume of the radiation sensitive material.

47. A method according to claim 46, wherein said form mold further comprises an integrated mask and wherein the step of creating a radiation interference pattern comprises directing radiation through the integrated mask.

48. A method according to claim 46, wherein said creating step comprises creating a radiation interference pattern to form the internal structure within the volume of the radiation sensitive material with a nano-scale pattern, a milli-scale pattern, or a micro-scale pattern, and wherein said contacting step comprises contacting the radiation sensitive material with the patterned surface of the form mold to form a shaped surface with a nano-scale pattern, a milli-scale pattern, or a micro-scale pattern.

49. A method according to claim 48, wherein the internal structure within the volume of the radiation sensitive material and the shaped surface both have the same scale pattern.

50. A method according to claim 48, wherein the internal structure within the volume of the radiation sensitive material and the shaped surface have different scale patterns.

51. A method according to claim 46, wherein the step of creating a radiation interference pattern formed by the interference of radiation beams in different planes creates a radiation interference pattern with variation in a direction parallel to the surface of the object on which the structure is to be formed and variation within the radiation sensitive material in a direction perpendicular to the surface of the object on the structure is to be formed.

52. A method according to claim 46, wherein said contacting step to form a shaped surface having a pattern corresponding to the patterned surface of the form mold and said exposing step to effect a chemical change, a physical change, or both a chemical change and a physical change in the radiation sensitive material to form an internal structure corresponding to the radiation interference pattern within the volume of the radiation sensitive material occur at the same time.

* * * * *